US010108099B2

(12) United States Patent
Fukatsu et al.

(10) Patent No.: US 10,108,099 B2
(45) Date of Patent: Oct. 23, 2018

(54) TONER

(71) Applicant: CANON KABUSHIKI KAISHA, Tokyo (JP)

(72) Inventors: Makoto Fukatsu, Suntou-gun (JP); Manami Haraguchi, Yokohama (JP); Atsushi Nakamoto, Tokyo (JP); Masayoshi Kato, Tokyo (JP); Kazuhisa Kemmochi, Suntou-gun (JP); Takahiro Kawamoto, Yokohama (JP); Takeshi Yamamoto, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/793,206

(22) Filed: Oct. 25, 2017

(65) Prior Publication Data

US 2018/0046104 A1 Feb. 15, 2018

Related U.S. Application Data

(62) Division of application No. 15/153,452, filed on May 12, 2016, now Pat. No. 9,829,815.

(30) Foreign Application Priority Data

May 14, 2015 (JP) ................................ 2015-099479
May 14, 2015 (JP) ................................ 2015-099480

(51) Int. Cl.
*G03G 9/093* (2006.01)
*G03G 9/087* (2006.01)
*G03G 9/08* (2006.01)

(52) U.S. Cl.
CPC ....... *G03G 9/08704* (2013.01); *G03G 9/0825* (2013.01); *G03G 9/08711* (2013.01); *G03G 9/08755* (2013.01); *G03G 9/08782* (2013.01); *G03G 9/09321* (2013.01); *G03G 9/09364* (2013.01); *G03G 9/09371* (2013.01); *G03G 9/09392* (2013.01); *H05K 999/99* (2013.01)

(58) Field of Classification Search
CPC ............... G03G 9/093; G03G 9/09507; G03G 9/09314; G03G 9/09521
See application file for complete search history.

(56) References Cited

U.S. PATENT DOCUMENTS 8,455,167 B2 * 6/2013 Shiotari ............... G03G 9/0815
430/108.6

* cited by examiner

*Primary Examiner* — Hoa V Le
(74) *Attorney, Agent, or Firm* — Canon U.S.A., Inc. IP Division

(57) ABSTRACT

There is provided a toner including toner base particles and an external additive in which the external additive is prevented from being buried in the base particles. The toner can maintain a high transfer efficiency over an extended period of use. The toner includes: (1) toner base particles containing a cycloolefin copolymer and a polyethylene; or (2) toner base particles whose surfaces contain a resin having an elastic deformation rate of 70% or more and a melting temperature of 125.0° C. or less.

3 Claims, 1 Drawing Sheet

TONER

CROSS REFERENCE TO RELATED APPLICATIONS

This application is a Divisional of U.S. patent application Ser. No. 15/153,452 filed May 12, 2016, which claims priority to Japanese Patent Application No. 2015-099479 filed May 14, 2015, and Japanese Patent Application No. 2015-099480 filed May 14, 2015, all of which are hereby incorporated by reference herein in their entireties.

BACKGROUND

Field of the Disclosure

The present disclosure relates to a toner used for electrophotographic image forming methods that can be applied to copy machines, printers, facsimiles, and multifunctional machines used in these apparatuses.

Description of the Related Art

As well as being used for copying a document, electrophotographic image forming apparatuses including copy machines are used as information output apparatuses connected to other information apparatuses by digitizing the information. Accordingly, the toner used in such electrophotographic image forming apparatuses is increasingly required to exhibit high performance in forming high-quality images with high definition at a high speed with high reliability.

In particular, since electrophotographic apparatuses are being increasingly used in a variety of environment as the market of the apparatuses is growing, the apparatuses are required to form images having stable quality independent of the environment.

In addition, in view of reliability, it is required to provide the apparatuses that can form images without degrading image quality over a long time.

For example, it has been known that toners used for electrophotographic applications deteriorate in chargeability in high-humidity environment. This deterioration can negatively affect the resulting image quality. For example, fogging can occur. Fogging is a type of scumming caused by a portion of the toner slightly developed in a blank region that is not intended to be printed.

Typically, an external additive made up of functional particles is applied to the surfaces of the toner base particles (resin particles) to impart fluidity and chargeability and to function as a spacer between the toner and members of the image forming apparatus. The toner however receives a shear stress in an image forming apparatus while being used for outputting images over a long time. Consequently, the external additive is removed from the base particles or in the base particles. This is the cause of reduced chargeability and fluidity and deterioration of the function as the spacer between the toner and the photosensitive drum, thus making it difficult to transfer all the toner on the photosensitive drum to a recording medium or an intermediate transfer member, that is, reducing transfer efficiency. Consequently, the quality of the resulting image can be degraded. For example, the evenness in image density is extremely degraded in a high-density region of the image.

The fixing system of image forming apparatuses is being changed from a conventional system using a hard roller having a high heat capacity to a light-pressure fixing system using a fixing film or belt having a low heat capacity, from the viewpoint of energy saving for reducing power consumption.

In the light-pressure fixing system, the heat capacity of the fixing member is reduced from the viewpoint of reducing the time taken to raise the temperature of the system to a fixing temperature set (controlled) for fixing, and of enabling quick start. If the heat capacity of the fixing member is reduced, the temperature of the fixing member decreases more than in a conventional hard roller system when continuous high-speed copy is made. Accordingly, a toner that can be fixed at a lower temperature is required, and it is desirable that the low-temperature fixability of the toner is further increased.

From the viewpoint of reducing the heat capacity, a durable toner having good environmental stability of chargeability and capable of outputting images over a long time without much degrading the image quality and having good low-temperature fixability is more desired than ever, and a variety of attempts have been made.

Japanese Patent Laid-Open No. 2004-219507 discloses a toner using a cycloolefin copolymer as a binder resin. Cycloolefin copolymer is colorless and transparent, or has a high light transmittance, and is less hygroscopic. According to the description of the above-cited patent document, by using such a cycloolefin copolymer as a binder resin in a toner and further adding a polypropylene wax or a polyethylene wax as a releasing agent and an organic boron compound as a charge control agent, a toner superior in productivity, storage stability, fixability, transparency, and environmental stability can be provided. In addition, a developing device in which the occurrence of fogging and ghosts is prevented can also be provided.

Even in this toner, further improvement is desired for reducing the deterioration in transferability that can occur when images have been output over a long time. The deterioration in transferability can be caused by a phenomenon in which the external additive is buried in the toner base particles.

SUMMARY OF THE DISCLOSURE

The present disclosure provides a toner made up of toner base particles and an external additive in which the external additive is prevented from being buried in the toner base particles. The toner can keep the transferability thereof high over a long period of time and can produce images having stable high quality, independent of environment over a long time.

The toner according to an aspect of the present disclosure comprises toner base particles and an external additive. The surfaces of the toner base particles contain a cycloolefin copolymer and a polyethylene, and the polyethylene has a density of less than 0.930 g/cm$^3$ and a weight average molecular weight in the range of 10 thousand to 5 million.

The toner according to another aspect of the present disclosure comprises toner base particles and an external additive, and a resin which has an elastic deformation rate of 70% or more and a melting temperature of 125.0° C. or less is contained in surfaces of the toner base particles.

Further features of the present disclosure will become apparent from the following description of exemplary embodiments with reference to the attached drawings.

DESCRIPTION OF THE EMBODIMENTS

Figure 1:
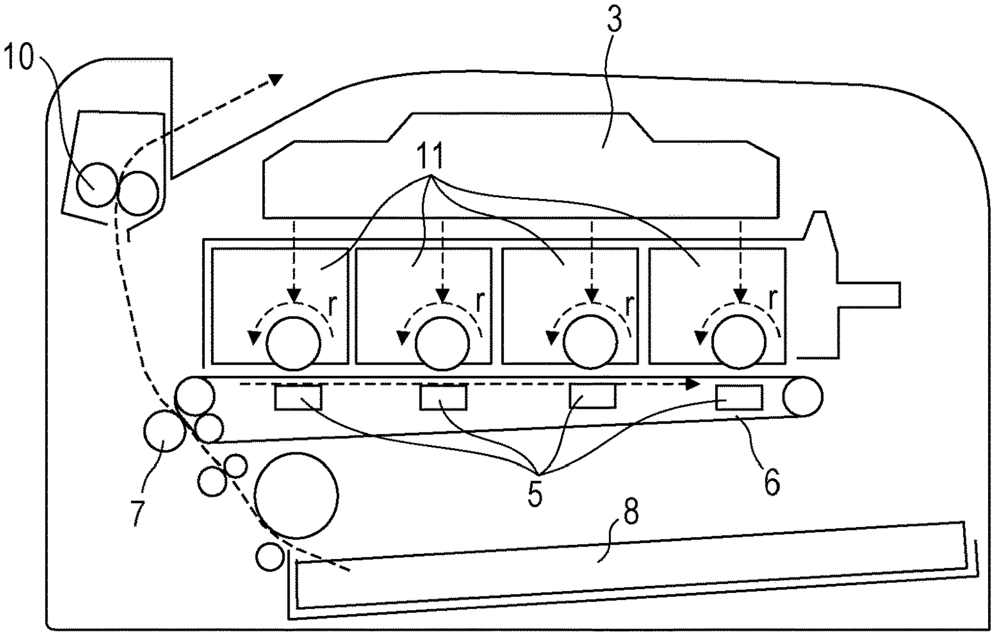
FIG. 1 is a schematic view of an image forming apparatus in accordance with one or more embodiments of the subject disclosure.

Exemplary embodiments of the subject matter of the present disclosure will now be described.

Toner

If the external additive attached to the surfaces of toner base particles of a toner are buried in the toner base particles, the adhesion of the toner to the photosensitive drum 1 is increased. Consequently, the transferability of the toner is reduced, and a large part of the toner is likely to remain on the photosensitive drum 1 without being transferred. This causes image defects such as unevenness in density in high-density regions of images.

The present inventors found through their studies that it depends heavily on the degree of plastic deformation of the resin defining the surfaces of the toner particles whether or not the external additive on the toner base particles is buried in the base particles by a shear stress applied in the developing device.

The external additive on the surfaces of the toner base particles has a particle size from several nanometers to about 500 nm. When an image is output, shear stresses are placed on various portions in the developing device. For example, shear stresses are placed on the toner in rubbing sections between a developing roller 14 and a feed roller 15, between the developing roller 14 and a control blade 16, and between the developing roller 14 and the photosensitive drum 1, and the like. At this time, the external additive on the surfaces of the toner base particles is pressed against some members of the apparatus, thereby deforming the resin defining the surface of the toner particles. After the toner has passed through the rubbing section, the shear stress is removed from the toner, and accordingly, the external additive is also unloaded from the surfaces of the toner base particles. The external additive is however buried to the extent corresponding to the degree of plastic deformation, which is determined depending on the elastic deformation rate of the resin of the surfaces of the toner particles.

First Embodiment

The toner base particles whose surfaces contain a low-density polyethylene having a density of less than 0.930 $g/cm^3$ and a weight average molecular weight of 10 thousand to 5 million, as well as a cycloolefin copolymer, allows a high elastic deformability to be imparted from the low-density polyethylene to the surfaces of the toner particles. The external additive is thus prevented effectively from being buried in the toner base particles. Consequently, the toner can stably form satisfactory images over a long time.

Second Embodiment

In another embodiment, the elastic deformation rate Es of the resin defining the surfaces of the toner particles is increased so that the resin can push back the external additive that is temporarily buried in the toner particles with a shear stress applied when the toner passes through a rubbing section in the developing unit. It is thus expected that the degree of burying the external additive can be reduced.

By allowing a resin having an elastic deformation rate Es of 70% or more to be contained in the surfaces of the toner base particles, the external additive can be prevented effectively from being buried. In this instance, the melting temperature Tm of the resin is controlled to 125.0° C. or less so that the resin can have desired melting properties and thus exhibit good fixability while the degree of plastic deformation thereof is reduced. The elastic deformation rate Es is desirably 75% or more and 85% or less. The melting temperature Tm is desirably 120.0° C. or less, such as 118.0° C. or less, and also desirably 100.0° C. or more.

The elastic deformation rate and the meting temperature of the resin of the surfaces of the toner particles are measured by the following methods.

Measurement of Elastic Deformation Rate

The elastic deformation rate of the resin mentioned herein is measured in the following procedure.

First, 10% solution of the resin to be measured is prepared by dissolving the entirety of the resin in a solvent, with heating if necessary. The solution is applied onto the surface of a 10 cm×10 cm aluminum plate. After being allowed to stand for about 12 hours, the resin coating is smoothed by leveling, and then the solvent is removed in a vacuum heating dryer. The resulting resin coating film is heated and pressed under reduced pressure with a heat press machine to form a substantially flat uniform resin film sample with a thickness of about 50 μm not containing air bubbles or the like.

The resulting resin film sample on the aluminum plate is set in a micro hardness tester ENT 1100 (manufactured by Elionix) for measuring the elastic deformation. For this measurement, a maximum load of $9.8\times10^{-4}$ N (100 mgf) divided into 1000 parts is applied to the sample at intervals of 50 ms using Berkovich type diamond indenter (angle: 115°). After the sum of applied loads has reached the maximum, the load is reduced step by step in the same manner as in the application of the load. Thus the amount of largest displacement and the degree of plastic deformation are measured. The amount of displacement is measured at randomly selected 100 points. Ten largest measurements and ten lowest measurements are omitted from the 100 measurements, and the rest of the measurements, that is, 80 measurements, are used for calculating the amount of largest displacement Sa and the degree of plastic deformation Ia. The elastic deformation rate Es is determined using the equation: $Es=(Sa-Ia)\times100/Sa$ Measurement of Melting Temperature Tm For measuring the melting temperature Tm of the resin, heating test is performed using a constant-pressure capillary extrusion rheometer, Flow Tester CFD-500 (manufactured by Shimadzu Scientific Instruments).

Specifically, the measurement is performed under the following conditions:

Die diameter: 0.5 mm
Die length: 1.0 mm
Total weight of weights: 500 g
Heating rate: 4° C./min
Preheating time: 420 s

Sample Preparation: 2 g of Resin is Formed into a Pellet of 1 cm in Diameter The melting temperature Tm is determined as below. A flow curve showing the relationship between the measurement temperature and the piston stroke is prepared according to the heating test using the Flow Tester. The melting temperature Tm is the temperature at a piston stroke point STm defined by the following equation:

$$STm = Smin + (Smax - Smin)/2$$
$$= (Smax + Smin)/2.$$

In the equation, Smin represents the lowest piston stroke point after the sample has reached the softening temperature Ts at which the sample turns in a transition state from a solid state; and Smax represents the flow end point. Hence, the melting temperature is determined by what is called the ½ method.

The constituents of the toner will now be described in detail through a description of a method for producing the toner. The toner of the present disclosure may be produced through the following steps (1) to (4):

(1) Step of forming core particles;

(2) Step of preparing an aqueous dispersion liquid of resin fine particles containing a cycloolefin copolymer having a cyclic structure of 20 nm to 500 nm and a polyethylene having a density of less than 0.930 g/$cm^3$ and a weight average molecular weight of 10 thousand to 5 million;

(3) Step of applying the resin fine particles onto the surfaces of the core particles; and (4) Step of smoothing the surfaces of the toner particles defined by the core particle coated with the resin fine particles.

(1) Step of Forming Core Particles

The core particles contain a binder resin. The binder resin can be selected from among known resins including vinyl resins such as styrene-acrylic resin copolymer, polyester resins, and hybrid resins thereof.

If the toner is directly produced by a polymerization method, a monomer capable of producing a binder resin is used.

Examples of such a polymerizable monomer include styrene monomers, such as styrene, o-methylstyrene, m-methylstyrene, p-methylstyrene, o-ethylstyrene, m-ethylstyrene, and p-ethylstyrene; acrylate monomers, such as methyl acrylate, ethyl acrylate, propyl acrylate, butyl acrylate, octyl acrylate, dodecyl acrylate, stearyl acrylate, behenyl acrylate, 2-ethylhexyl acrylate, dimethylaminoethyl acrylate, diethylaminoethyl acrylate, acrylonitrile, and amide acrylate; methacrylate monomers, such as methyl methacrylate, ethyl methacrylate, propyl methacrylate, butyl methacrylate, octyl methacrylate, dodecyl methacrylate, stearyl methacrylate, behenyl methacrylate, 2-ethylhexyl methacrylate, dimethylaminoethyl methacrylate, diethylaminoethyl methacrylate, methacrylonitrile, and amide methacrylate; and olefins, such as butadiene, isoprene, and cyclohexene.

These monomers may be used singly, or generally in a form of an appropriate mixture prepared so that the theoretical glass transition temperature (Tg) specified in Polymer Handbook 3rd edition, pp. 209-277, 1989 (edited by Brandrup and E. H. Immergut, published by John Wiley & Sons) can be 40° C. to 75° C.

When the theoretical glass transition temperature is in this range, the resulting toner exhibits good stability in storage and in long-time use and can form full color images with a high transparency.

In order to enhance the mechanical strength of the toner particles and control the molecular weight of the binder resin, a crosslinking agent may be used when the binder resin is synthesized.

Examples of the crosslinking agent include bifunctional crosslinking agents, such as divinylbenzene, 2,2-bis(4-acryloxyethoxyphenyl)propane, 2,2-bis(4-methacryloxyphenyl) propane, diallyl phthalate, ethylene glycol diacrylate, 1,3-butylene glycol diacrylate, 1,4-butanediol diacrylate, 1,5-pentanediol diacrylate, 1,6-hexanediol diacrylate, neopentyl glycol diacrylate, diethylene glycol diacrylate, triethylene glycol diacrylate, tetraethylene glycol diacrylate, diacrylates of polyethylene glycols #200, #400 and #600, dipropylene glycol diacrylate, polypropylene glycol diacrylate, polyesterified diacrylate, and dimethacrylates corresponding to the above diacrylates.

Polyfunctional crosslinking agents may also be used, such as pentaerythritol triacrylate, trimethylolethane triacrylate, trimethylolpropane triacrylate, tetramethylolmethane tetraacrylate, oligoester acrylate, methacrylates corresponding to these acrylates, triallyl cyanurate, triallyl isocyanurate, and triallyl trimellitate.

In view of the fixability and offset resistance of the toner, the crosslinking agent may be used in a proportion of 0.05 part to 10 parts by mass, such as 0.1 part to 5 parts by mass, relative to 100 parts by mass of the monomer.

The toner of the present disclosure may be a magnetic toner or a nonmagnetic toner. For the magnetic toner, a magnetic material is advantageously used. Examples of the magnetic material include iron oxides, such as magnetite, maghemite, and ferrite, iron oxides containing another metal oxide, metals such as Fe, Co, and Ni, and alloys or mixtures of these metals and other metals such as Al, Co, Cu, Pb, Mg, Ni, Sn, Zn, Sb, Be, Bi, Cd, Ca, Mn, Se, Ti, W, and V.

More specifically, examples of the magnetic material include triiron tetroxide ($Fe_3O_4$), iron sesquioxide ($\gamma$-$Fe_2O_3$), zinc iron oxide ($ZnFe_2O_4$), yttrium iron oxide ($Y_3Fe_5O_{12}$), cadmium iron oxide ($CdFe_2O_4$), gadolinium iron oxide ($Gd_3Fe_5O_{12}$), copper iron oxide ($CuFe_2O_4$), lead iron oxide ($PbFe_{12}O_{19}$), nickel iron oxide ($NiFe_2O_4$), neodymium iron oxide ($NdFe_2O_3$), barium iron oxide ($BaFe_{12}O_{19}$), magnesium iron oxide ($MgFe_2O_4$), manganese iron oxide ($MnFe_2O_4$), lanthanum iron oxide ($LaFeO_3$), iron powder (Fe), cobalt powder (Co), and nickel powder (Ni).

These magnetic materials may be used singly or in combination. Fine powder of triiron tetroxide or $\gamma$-iron sesquioxide is suitable to provide the subject matter of the present disclosure.

In view of the developability of the resulting toner, the magnetic material has an average particle size in the range of 0.1 μm to 2 μm (desirably 0.1 μm to 0.3 μm), and the magnetic properties thereof when 795.8 kA/m is applied are 1.6 kA/m to 12 kA/m in coercive force, 5 $Am^2$/kg to 200 $Am^2$/kg (desirably 50 $Am^2$/kg to 100 $Am^2$/kg) in saturation magnetization, and 2 $Am^2$/kg to 20 $Am^2$/kg in residual magnetization.

The magnetic material may be used with a proportion of 10 parts to 200 parts by mass, such as 20 parts to 150 parts by mass, relative to 100 parts by mass of the binder resin.

When the toner is a nonmagnetic toner, the coloring agent can be selected from among known coloring agents including dyes and pigments.

For example, magenta coloring agents include C.I. Pigment Reds 1, 2, 3, 4, 5, 6, 7, 8, 9, 10, 11, 12, 13, 14, 15, 16, 17, 18, 19, 21, 22, 23, 30, 31, 32, 37, 38, 39, 40, 41, 48, 49, 50, 51, 52, 53, 54, 55, 57, 58, 60, 63, 64, 68, 81, 83, 87, 88, 89, 90, 112, 114, 122, 123, 163, 202, 206, 207, and 209; C.I. Pigment Violet 19; and C.I. Vat Reds 1, 2, 10, 13, 15, 23, 29, and 35.

Cyan coloring agents include C.I. Pigment Blues 2, 3, 15:1, 15:3, 16, 17, 25, and 26, C.I. Vat Blue 6, C.I. Acid Blue 45, and a copper phthalocyanine pigment having a phthalocyanine skeleton substituted by one to five methyl phthalimidomethyl groups.

Yellow coloring agents include C.I. Pigment Yellows 1, 2, 3, 4, 5, 6, 7, 10, 11, 12, 13, 14, 15, 16, 17, 23, 65, 73, 74, 83, 93, 155, and 180; C.I. Solvent Yellows 9, 17, 24, 31, 35, 58, 93, 100, 102, 103, 105, 112, 162, and 163; and C.I. Vat Yellows 1, 3, and 20.

Black coloring agents that can be used in the toner of the present disclosure include carbon black, aniline black, acetylene black, and combinations of yellow, magenta and cyan coloring agents adjusted so as to be black.

The proportion of the coloring agent in total depends on the coloring agent, and may be in the range of 0.1 part to 60 parts by mass, such as 0.5 part to 50 parts by mass, relative to 100 parts by mass of the binder resin.

A wax may be used. Examples of the wax component include paraffin waxes, microcrystalline waxes, petroleum waxes and their derivatives, such as petrolatum, montan waxes and their derivatives, hydrocarbon waxes produced by Fischer-Tropsch process and their derivatives, polyolefin waxes and their derivatives represented by polyethylene, and natural waxes and their derivatives, such as carnauba wax and candelilla wax. The derivatives include oxides, block copolymers with vinyl monomers, and graft-modified forms.

Other wax components may be used, such as higher aliphatic alcohols or the like, fatty acids such as stearic acid and palmitic acid, acid amides or esters thereof, hydrogenated castor oil and derivatives thereof, plant waxes, and animal waxes. These waxes may be used singly or in combination.

The proportion of the total mass of wax components added may be in the range of 2.5 parts to 15.0 parts by mass, such as 3.0 parts to 10.0 parts by mass, relative to 100 parts by mass of the binder resin.

When the proportion of the wax component is in such a range, the resulting toner can be satisfactorily fixed in an oilless manner. Also, when the proportion of the wax component in the toner is in such an appropriate proportion, the amount of the wax component present on the surfaces of the toner particles is minimized. Consequently, the wax component is unlikely to much affect the chargeability.

The toner of the present disclosure may contain a charge control agent to control the chargeability. The charge control agent may be selected from among the following compounds.

Negatively chargeable charge control agents include polymers having a sulfo group or a sulfonate or sulfonic acid ester group; salicylic acid derivatives and metal complexes thereof; monoazo metal compounds; acetyl acetone metal compounds; aromatic oxycarboxylic acids and metal salts, anhydrides, and esters thereof; aromatic monocarboxylic or polycarboxylic acids and metal salts, anhydrides, and esters thereof; phenol derivatives such as bisphenols; urea derivatives; boron compounds; and calixarene.

Positively chargeable charge control agents include nigrosine and fatty acid metal salt-modified nigrosine compounds; guanidine compounds; imidazole compounds; quaternary ammonium salts such as tributylbenzylammonium-1-hydroxy-4-naphthsulfonates and tetrabutylammonium tetrafluoroborate; onium salts similar to quaternary ammonium salts, such as phosphonium salts, and chelate pigments of onium salts; triphenylmethane dye and lake pigments thereof (prepared using a lake-forming agent, such as phosphotungstic acid, phosphomolybdic acid, phosphotungsten molybdic acid, tannic acid, lauric acid, gallic acid, ferricyanic acid, or ferrocyanide); higher fatty acid salts; diorganotin oxides, such as dibutyltin oxide, dioctyltin oxide, and dicyclohexyltin oxide; and diorganotin borates, such as dibutyltin borate, dioctyltin borate, and dicyclohexyltin borate.

The number average particle size (D1) of the toner is desirably in the range of 3.0 μm to 15.0 μm, such as 4.0 μm to 12.0 μm from the viewpoint of ensuring stable chargeability and forming high-quality images.

The number average particle size (D1) of the toner depends on the particle size of the core particles, and the particle size of the core particles is controlled in a different manner depending on the production method of the core particles.

When the toner particles is produced by a suspension polymerization method, for example, the particle size of the core particles can be controlled by varying the concentration of the dispersant used for preparing the aqueous medium, the agitation or stirring speed for reaction, or the reaction time.

The core particles of the toner may be produced by a variety of methods including:

a kneading pulverization method that produces toner particles through kneading, pulverization, and sizing of a mixture of a binder resin, a pigment, and a releasing agent;

a suspension polymerization method that produces toner particles by dispersing or dissolving a mixture of a polymerizable monomer, a pigment, and a releasing agent, and granulating the dispersion or solution in an aqueous medium for polymerization reaction;

a dissolution suspension method that produces toner particles by dissolving or dispersing a mixture of a binder resin, a pigment, and a releasing agent in an organic solvent, granulating the dispersion or solution in an aqueous medium, and then removing the solvent; and an emulsion aggregation method that produces toner particles by finely dispersing a binder resin, a pigment, and a releasing agent in an aqueous medium, and aggregating the particles in the dispersion.

Although the core particles may be produced by any method, methods that form particles in an aqueous medium, such as the suspension polymerization method, the dissolution suspension method, and the emulsion aggregation method, are advantageous. These methods can relatively easily produce toner particles having a high average circularity.

If the core particles are produced by the suspension polymerization, first, a polymerizable monomer capable of producing a binder resin, a coloring agent, a wax component, a polymerization initiator, and optionally other additives, are mixed to prepare a polymerizable monomer composition. The polymerizable monomer composition is dispersed in an aqueous medium to be granulated into particles. The polymerizable monomer in the particles is polymerized to yield toner particles in the aqueous medium.

The polymerization initiator used in the suspension polymerization method can be selected from among the known polymerization initiators including azo compounds, organic peroxides, inorganic peroxides, organic metal compounds, and photopolymerization initiators.

Examples of such a polymerization initiator include azo polymerization initiators, such as 2,2'-azobis(isobutyronitrile), 2,2'-azobis(2-methylbutyronitrile), 2,2'-azobis(4-methoxy-2,4-dimethylvaleronitrile), 2,2'-azobis(2,4-dimethylvaleronitrile), and dimethyl 2,2'-azobis(isobutyrate); organic peroxide polymerization initiators, such as benzoyl peroxide, di-tert-butyl peroxide, tert-butylperoxyisopropyl monocarbonate, tert-hexyl peroxybenzoate, and tert-butyl peroxybenzoate; inorganic peroxide polymerization initiators, such as potassium persulfate and ammonium persulfate; and redox initiators, such as hydrogen peroxide with ferrous ion, BPO-dimethyl aniline, and cerium (IV) salt-alcohol.

The photopolymerization initiator may be an acetophenone-based, a benzoin ether-based, or a ketal-based initiator.

These polymerization initiators may be used singly or in combination.

The proportion of the polymerization initiator may be 0.1 part to 20 parts by mass, such as 0.1 part to 10 parts by mass, relative to 100 parts by mass of the polymerizable monomer.

Although the suitable polymerization initiator depends on the polymerization method, one or more initiators are selected for use in reference to the 10-hour half-life temperature.

The aqueous medium used in the suspension polymerization method may contain a dispersion stabilizer.

The dispersion stabilizer may be selected from among known inorganic and organic dispersion stabilizers.

Exemplary inorganic dispersion stabilizers include calcium phosphate, magnesium phosphate, aluminum phosphate, zinc phosphate, magnesium carbonate, calcium carbonate, calcium hydroxide, magnesium hydroxide, aluminum hydroxide, calcium metasilicate, calcium sulfate, barium sulfate, bentonite, silica, and alumina. Exemplary organic dispersion stabilizers include polyvinyl alcohol, gelatin, methyl cellulose, methyl hydroxypropyl cellulose, ethyl cellulose, carboxymethyl cellulose sodium salt, and starch.

A nonionic, an anionic, or a cationic surfactant may be used. Examples of such a surfactant include sodium dodecyl sulfate, sodium tetradecyl sulfate, sodium pentadecyl sulfate, sodium octyl sulfate, sodium oleate, sodium laurate, potassium stearate, and calcium oleate.

Among these compounds, poorly water-soluble inorganic dispersion stabilizers soluble in acid are advantageous as the dispersion stabilizer used in the present disclosure.

The proportion of the dispersion stabilizer used is desirably in the range of 0.2 part to 2.0 parts by mass relative to 100 parts by mass of the polymerizable monomer from the viewpoint of stabilizing the droplets of the polymerizable monomer composition in the aqueous medium.

Water may be used as the aqueous medium with a proportion in the range of 300 parts to 3000 parts by mass to 100 parts by mass of the polymerizable monomer composition.

Although a commercially available dispersion stabilizer may be used as it is, a dispersion stabilizer produced in water with high-speed agitation is desirably used.

For example, if calcium phosphate is used as the dispersion stabilizer, a sodium phosphate aqueous solution and a calcium chloride aqueous solution are mixed with high-speed agitation for forming fine particles of calcium phosphate. Thus produced calcium phosphate can be used as a suitable dispersion stabilizer.

In the emulsion aggregation method, the core particles may be produced through the following process steps: the step (dispersion step) of preparing aqueous dispersions of toner constituents including a binder resin, a coloring agent, and a wax; the step (aggregation step) of mixing the aqueous dispersions to form aggregated particles; the step (fusing step) of heating the aggregated particles to be fused; and the step of washing; and the step of drying.

In the dispersion step of dispersing each of the toner constituents, a dispersant, such as a surfactant, may be used. More specifically, each aqueous dispersion is prepared by dispersing a toner constituent and a surfactant in an aqueous medium. For preparing the aqueous dispersion, a dispersing machine is used, and examples thereof include rotary shear homogenizers, media dispersing devices such as a ball mill, a sand mill, and an attritor, and high-pressure counter collision dispersing machines.

The surfactant may be a water-soluble polymer or an inorganic compound, and may be an ionic or nonionic surfactant. In view of dispersibility, highly dispersible ionic surfactants, particularly anionic surfactants, are advantageous.

The molecular weight of the surfactant is desirably in the range of 100 to 10,000, such as 200 to 5,000, in view of detergency and performance as surfactant.

Examples of the surfactant include water-soluble polymers, such as polyvinyl alcohol, methyl cellulose, carboxymethyl cellulose, and sodium polyacrylate; anionic surfactants, such as sodium dodecylbenzenesulfonate, sodium octadecyl sulfate, sodium oleate, sodium laurate, and potassium stearate; cationic surfactants, such as laurylamine acetate and lauryl trimethyl ammonium chloride; amphoteric surfactants, such as lauryldimethylamine oxide; nonionic surfactants, such as polyoxyethylene alkyl ether, polyoxyethylene alkyl phenyl ether, and polyoxyethylene alkyl amine; and inorganic compounds, such as tricalcium phosphate, aluminum hydroxide, calcium sulfate, calcium carbonate, and barium carbonate. These surfactants may be used singly or in combination.

For forming aggregated particles, for example, a pH adjuster, a flocculant, a stabilizer, and the like are added to and mixed with the aqueous dispersion, and a temperature, a mechanical force (agitation), or the like is applied to the mixture. The method is however not limited to this.

The pH adjuster can be selected from among, but is not limited to, alkalis, such as ammonia and sodium hydroxide, and acids, such as nitric acid and citric acid.

The flocculant may be selected from among, but is not limited to, inorganic metal salts, such as sodium chloride, magnesium carbonate, magnesium chloride, magnesium nitrate, magnesium sulfate, calcium chloride, and aluminum sulfate, and divalent or higher valent metal complexes.

The stabilizer is typically a surfactant. Examples of such a surfactant include, but are not limited to, water-soluble polymers, such as polyvinyl alcohol, methyl cellulose, carboxymethyl cellulose, and sodium polyacrylate; anionic surfactants, such as sodium dodecylbenzenesulfonate, sodium octadecyl sulfate, sodium oleate, sodium laurate, and potassium stearate; cationic surfactants, such as laurylamine acetate and lauryl trimethyl ammonium chloride; amphoteric surfactants, such as lauryldimethylamine oxide; nonionic surfactants, such as polyoxyethylene alkyl ether, polyoxyethylene alkyl phenyl ether, and polyoxyethylene alkyl amine; and inorganic compounds, such as tricalcium phosphate, aluminum hydroxide, calcium sulfate, calcium carbonate, and barium carbonate. These surfactants may be used singly or in combination.

The average particle size of the aggregated particles formed in this step can be controlled to, but is not limited to, the same level as the intended average particle size of the toner particles to be produced. This control can be easily made by, for example, appropriately setting or varying the temperature at which additives such as flocculant are added and mixed. Any one of the above-cited pH adjusters or surfactants may also be added, if necessary, in order to prevent the toner particles from fusing with each other.

The aggregated particles are heated to fuse to form toner particles.

In this operation, the heating temperature is set in the range from the glass transition temperature (Tg) of the resin in the aggregated particles to the decomposition temperature of the resin. For example, after aggregation is stopped by adding a surfactant or adjusting the pH while agitation or stirring is continued under the same conditions as in the aggregation step, the aggregated particles are fused with one another by being heated to a temperature higher than or equal to the glass transition temperature of the resin.

In this operation, the heating is performed for a period of time for which the aggregated particles can be sufficiently fused. More specifically, it is about 10 minutes to 10 hours.

(2) Step of Preparing Aqueous Dispersion Liquid of Resin Fine Particles Containing Cycloolefin Copolymer and Polyethylene The cycloolefin copolymer is a polymer produced by a process using, for example, a metallocene catalyst, a Ziegler catalyst, and a catalyst for metathesis polymerization, that is, double bond opening and ring-opening polymerization reaction. Cycloolefin copolymers have been known, and some synthesis processes thereof are disclosed in, for example, Japanese Patent Laid-Open Nos. 5-339327, 5-9223, and 6-271628 and European Patent Application Publication Nos. 203799 A, 407870 A, 283164 A, and 156464 A.

Advantageously, the cycloolefin copolymer used herein is a colorless transparent copolymer having a high light transmittance of a lower alkene (α-olefin, noncyclic olefin in a broad sense) having a carbon number of 2 to 12, desirably 2 to 6, and a cyclic or polycyclic compound (cycloolefin) having a carbon number of 3 to 17, desirably 5 to 12, and having at least one double bond. The lower alkene that can form the cyclic olefin polymer may be ethylene, propylene, or butylene, and the cycloolefin may be norbornene, tetracyclododecene (TCD), dicyclopentadiene (DCPD), or cyclohexene. Advantageously, ethylene is selected as the lower alkene, and norbornene is selected as the cycloolefin.

According to the above-cited documents, the cycloolefin copolymer can be produced by polymerizing one or more monomers selected from cycloolefins, and optionally a monomer selected from noncyclic olefins, at a temperature of −78° C. to 150° C., desirably 20° C. to 80° C., and a pressure of 0.01 bar to 64 bar in the presence of a co-catalyst and a catalyst. The co-catalyst may be aluminoxane, and the catalyst may be a metallocene containing zirconium or hafnium. European Patent Application Publication No. 317262 A discloses other useful polymers, and a hydrogenated polymer or a copolymer of styrene and dicyclopentadiene may be used.

The cycloolefin copolymer used in the present disclosure may have the following properties:

(i) The number average molecular weight is 100 to 100,000, desirably 500 to 50000;

(ii) The weight average molecular weight is 200 to 300,000, desirably 3,000 to 200,000; and (iii) The glass transition temperature is −20° C. to 180° C., desirably 40° C. to 80° C.

The low-density polymethylene used herein having a density of less than 0.930 $g/cm^3$ may be produced by a known process.

More specifically, the low-density polyethylene may be selected as needed from polyethylenes produced in a high pressure process and polyethylenes produced by copolymerizing an α-olefin and ethylene with a catalyst in a middle/low pressure process. The weight average molecular weight of the polyethylene is 10 thousand to 5 million and is desirably 30 thousands to 200 thousands.

A method for preparing the aqueous dispersion liquid of resin fine particles will now be described.

A resin containing a cycloolefin copolymer and a resin containing a polyethylene having a density of less than 0.930 $g/cm^3$ and a weight average molecular weight of 10 thousand to 5 million are weighed out so as to have a desired proportion. Then, an oil phase prepared by dissolving the resins and further dissolving the resulting solution in a solvent insoluble in water is mixed with a water phase prepared by dissolving an anionic surfactant in ion exchanged water, and a shear force is applied to the mixture with an agitator to prepare an oil-in-water (O/W type) emulsion containing oil phases of several micrometers.

The resulting emulsion is treated several times with a wet atomization apparatus capable of applying a shear force even during heating. Thus an oil-in-water (O/W type) emulsion containing oil phases of 20 nm to 500 nm is prepared. The wet atomization apparatus may be, for example, Nanomizer manufactured by Yoshida Kikai or Starburst manufactured by Sugino Machine.

Then, the solvent is removed by distillation under reduced pressure to yield an aqueous dispersion liquid in which resin fine particles satisfying the following (i) and (ii) are dispersed:

(i) The particle size is in the range of 20 nm to 500 nm; and (ii) The resin fine particles contain cycloolefin copolymer and a polyethylene having a density of less than 0.930 $g/cm^3$ and a weight average molecular weight of 10 thousand to 5 million.

Although the case of using a resin fine particles containing a cycloolefin copolymer and a low-density polyethylene has been described, the feature of this case is not necessarily applied to the case where a resin having an elastic deformation rate Es of 70% or more and a melting temperature Tm of 125.0° C. or less is present in the surfaces of the toner particles. In order that the resin have these physical properties, however, it is advantageous to use resin fine particles containing the above-described cycloolefin copolymer and a resin having a high elastic deformation rate, such as a low-density polyethylene.

(3) Step of Applying Resin Fine Particles onto Surfaces of Core Particles

An aqueous dispersion liquid in which the core particles prepared in Step (1) are dispersed is prepared by using an anionic surfactant. The resulting dispersion liquid of the core particles is mixed with a desired amount of the aqueous dispersion liquid of the resin fine particles prepared in Step (2). Subsequently, dilute hydrochloric acid is gradually added as a flocculant to the mixture with stirring. Thus, an aqueous dispersion liquid of core particles uniformly coated with the resin fine particles is prepared.

For coating the core particles with the resin fine particles, the above-described wet process may be replaced with a dry process using a high-speed fluid mixer, such as Henschel mixer. If the core particles are formed by the emulsion aggregation method, the step of applying the resin fine particles may be performed at any time, such as immediately before or after fusing or at one time with fusing. In a case, this step may be performed at one time with Step (4) of smoothing the surfaces of the toner particles, which will be described later.

Advantageously, the proportion of the cycloolefin copolymer of the core particles is higher than that of the polyethylene in the surfaces of the toner particles.

(4) Step of Smoothing Surfaces of Toner Particles

The core particles uniformly coated with the resin fine particles produced in Step (3) are subjected to either or both of a dry process and a wet process for smoothing the surfaces defined by the resin fine particles, thus forming substantially spherical toner particles.

The wet process may be performed by, for example, heating an aqueous dispersion liquid of the core particles uniformly coated with the resin fine particles, produced in Step (3) under desired conditions to melt the resin fine particles so as to form surfaces along the profile of the surfaces of the core particles, thereby smoothing the surfaces. In this instance, the dispersion liquid is heated until a desire average circularity is obtained and then cooled to room temperature under appropriate conditions.

The resulting particles are washed, filtered, and dried to yield toner particles.

In the dry process for smoothing, after the core particles treated in Step (3) are separated from the aqueous dispersion liquid, the resin fine particles coating the core particles in a dried state may be mechanically crushed with a device such as a Henschel mixer or a hybridizer.

To the resulting toner, an external additive is added in view of chargeability and durability. Although the type and the amount of the external additive are not necessarily limited, the external additive may be a fine powder of silica, titanium oxide, alumina, and complex oxide thereof. The particles of the fine powder may be surface-treated.

An image forming apparatus capable of forming images with the toner of the present disclosure will now be described.

FIG. 1 is a schematic view of the image forming apparatus. The image forming apparatus shown in FIG. 1 is a full color laser printer using an electrophotographic process. The general structure of the image forming apparatus will be described below. The dimensions, materials, shapes, relative positions, and other features of the components of the apparatus are not limited to those described below unless otherwise specified.

Figure 2:
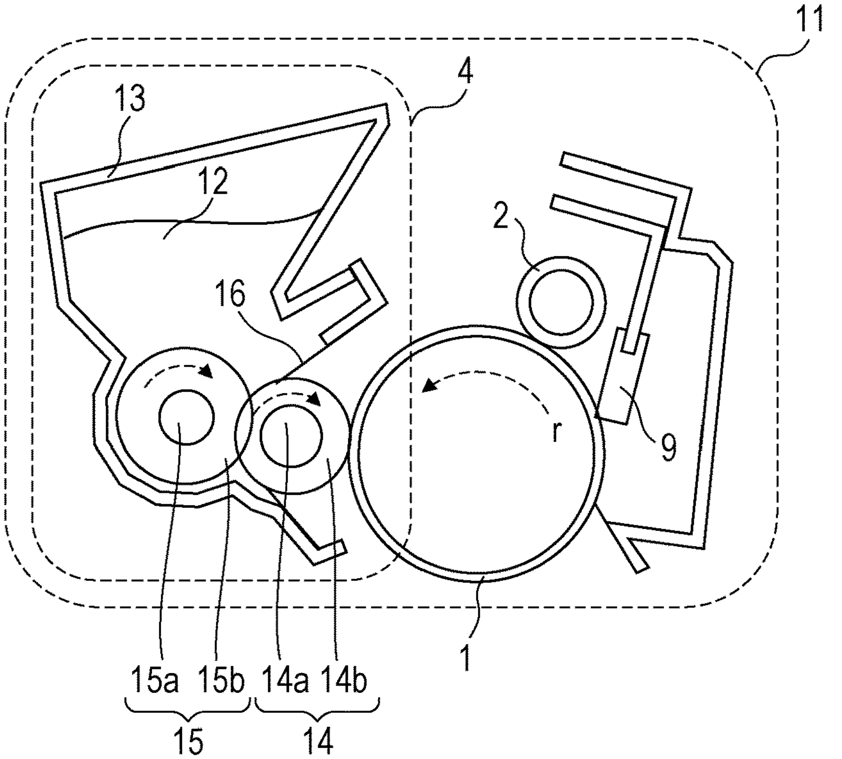
FIG. 2 is an illustrative representation of the image forming apparatus in accordance with one or more embodiments of the subject disclosure.

The image forming apparatus using the toner of the present disclosure is shown in FIGS. 1 and 2. The image forming apparatus includes photosensitive members 1, or image bearing members. Each photosensitive member 1 is rotated in the direction indicated by arrow r and charged to a potential Vd by a corresponding charging roller 2 or charging device. Subsequently, the photosensitive member 1 is exposed to a laser beam emitted from a laser beam device 3 or an exposure device, and thus an electrostatic latent image is formed on the surface of the photosensitive member 1. The electrostatic latent image is developed into a visible toner image by a developing device 4. The visible toner image on the photosensitive member 1 is transferred to an intermediate transfer member 6 by a primary transfer device 5 and then further transferred to a paper sheet 8, or recording medium, by a secondary transfer device 7. The portion of the toner remaining on the photosensitive member 1 without being transferred is scraped out with a cleaning blade 9, or cleaning device. The cleaned photosensitive member 1 will be repeatedly used for forming other images. The paper sheet 8 onto which the toner image has been transferred is ejected after the toner image has been fixed thereto by a fixing device 10.

As shown in FIG. 2, the photosensitive member 1, the charging roller 2, the developing device 4, and the cleaning blade 9 are integrated into a cartridge 11 capable of being removed from the body of the image forming apparatus. In FIG. 1, the image forming apparatus has four sections in which the cartridges 11 are mounted. Thus cartridges 11 each containing a yellow, a magenta, a cyan, or a black toner are mounted in that order from the upstream side of the direction in which the intermediate transfer member 6 moves. The toners are transferred to the intermediate transfer member 6 one after another, thereby forming a color image.

The photosensitive member 1, or photosensitive drum, includes an electroconductive substrate and an organic photosensitive member formed by applying a positive charge injection preventing layer, a charge generating layer, and a charge transport layer in that order on the substrate.

The charge transport layer is formed by dissolving a charge transport material and a binder in a solvent. Exemplary organic charge transport materials include acrylic resin, styrene resin, polyester, polycarbonate resin, polyacrylate, polysulfone, polyphenylene oxide, epoxy resin, polyurethane resin, alkyd resin, and unsaturated resin. These charge transport materials may be used single or in combination.

The charging roller 2 includes a mandrel that is an electroconductive support member, and a semiconductive rubber layer on the mandrel. The charging roller 2 exhibits a resistance of about $10^5\Omega$ when a voltage of 200 V is applied to the electroconductive drum.

The developing device 4 includes a toner 12 that is a developer, a developer container 13 containing the developer, a developing roller 14 that is a developer bearing member, a feed roller 15 that feeds the toner 12 to the developing roller 14, and a control blade 16 that is a developer control member configured to control the toner on the developing roller 14.

The developing roller 14 may include a mandrel electrode **14*a* that is an electroconductive support member, and an electroconductive rubber layer 14*b* on the periphery of the mandrel electrode 14*a*. The electroconductive rubber layer 14*b* is made of a rubber containing a conducting agent. The rubber of the rubber layer may be silicone rubber, urethane rubber, ethylene-propylene copolymer (EPDM), Hydrin, or a combination thereof. A material generally called rubber can be used. The conducting agent may be selected from among carbon particles, metal particles, and ion conducting particles. By dispersing the conducting agent in the rubber, the rubber layer has a desired resistivity. In order to adjust the hardness of the entire developing roller 14**, the amount of the rubber and the amount of filler may be controlled.

The feed roller 15 rotates with the developing roller 14 in contact therewith, and the developing roller 14 is in contact with an end of the control blade 16.

The feed roller 15 may include a mandrel electrode **15*a* that is an electroconductive support member, and a urethane foam layer 15*b* on the periphery of the mandrel electrode 15*a*. The feed roller 15 is rotated in a direction in which the feed roller 15 and the developing roller 14 have velocities opposite to each other at the contact portion thereof. The urethane foam layer 15*b* receives a powder pressure of the toner 12 present therearound, and takes the toner 12 therein by the rotation of the feed roller 15. The feed roller 15 thus containing the toner 12 feeds the toner 12 to the developing roller 14 at the contact portion with the developing roller 14, and further rubs the toner 12 to apply an auxiliary triboelectric charge to the toner 12**. In addition, the feed roller has the function of removing the toner remaining on the developing roller without being developed in the developing section.

When the toner 12 fed from the feed roller 15 to the developing roller 14 comes to the control blade 16, the toner 12 is controlled so as to have a desired charge amount and a desired thickness. The control blade 16 is disposed in a direction against the rotation of the developing roller 14. The control blade 16 controls the toner 12 on the developing roller 14 so as to form a toner layer have a uniform thickness and rubs the toner so as to apply a desired triboelectric charge to the toner. A voltage having a predetermined potential difference from the voltage of the developing roller 14 is applied to the control blade 16. This potential difference is intended to stabilize the toner layer.

The toner layer formed on the developing roller with the control blade is conveyed to the developing section in contact with the photosensitive drum and reversely developed there.

At the contact section, the developing roller 14 is regulated by a roller (not shown) at an end thereof so as to enter the photosensitive member 1 to a predetermined extent. The surface of the developing roller 14 is transformed into a developing nip by being pressed against the photosensitive drum, thus performing development in a stably contacting state. The developing roller 14 is rotated with a predetermined peripheral speed different from the photosensitive member 1 in the same direction as the photosensitive member 1 at the developing nip. The difference in peripheral speed stabilizes the amount of toner to be developed.

EXAMPLES

The process applied to produce the toners used in Examples and Comparative Examples will be described in detail.

Example 1

(1) Step of Forming Core Particles

Resin fine particles C1 were produced as core particles by a suspension polymerization method. Details of this process are as below.

Preparation of Polymerizable Monomer Composition

The following materials were mixed and dispersed in each other for 3 hours in a ball mill.

Styrene: 82.0 parts
2-Ethylhexyl acrylate: 18.0 parts
Divinylbenzene: 0.1 part
C.I. Pigment Blue 15:3: 5.5 parts
Polyester resin: 5.0 parts
(polycondensate of propylene oxide-modified bisphenol A and isophthalic acid, glass transition temperature Tg=65° C., weight average molecular weight Mw=10000, number average molecular weight Mn=6000)

The prepared dispersion liquid was heated to 60° C. while being stirred at a rotational speed of 300 rpm in a reactor equipped with a propeller stirring blade. Then, 12.0 parts of an ester wax (DSC-measured maximum endothermic peak temperature: 70° C., number average molecular weight Mn: 704) and 3.0 parts of 2,2'-azobis(2,4-dimethylvaleronitrile) were added to the dispersion liquid and dissolved to yield a polymerizable monomer composition.

Preparation of Dispersion Stabilizer

Into a 2 L four-neck flask equipped with a high-speed agitator T.K. Homomixer (manufactured by PRIMIX) were added 710 parts of ion exchanged water and 450 pats of 0.1 mol/L sodium phosphate aqueous solution, and the mixture was heated to 60° C. with stirring at a rotational speed of 12000 rpm. To this mixture was added 68.0 parts of 1.0 mol/L calcium chloride aqueous solution to prepare an aqueous dispersion medium containing a small amount of calcium chloride as a poorly water-soluble dispersion stabilizer.

Granulation and Polymerization

The polymerizable monomer composition was added to the aqueous disperse medium and granulated at a constant rotational speed of 12000 rpm for 15 minutes. The high-speed agitator was replaced with a propeller stirring blade, and polymerization was performed at an interior temperature of 60° C. for 5 hours and was further continued at an increased interior temperature of 80° C. for 3 hours. After the completion of polymerization, the unreacted monomer was evaporated at 80° C. under reduced pressure. Then, the product was cooled to 30° C. to yield a dispersion liquid of polymer fine particles.

Washing

The dispersion liquid of the polymer fine particles was placed in a washing vessel, and the pH of the dispersion liquid was adjusted to 1.5 by adding dilute hydrochloric acid with stirring. After being stirred for 2 hours, the dispersion liquid was filtered for liquid-solid separation, and thus polymer fine particles were obtained. The polymer fine particles were added to 1200 parts of ion exchanged water and dispersed by stirring. The resulting dispersion liquid was separated into a solid phase and a liquid phase through a filter. The sequence of these operations was performed three times to yield resin fine particles C1 as core particles.

(2) Step of Preparing Aqueous Dispersion Liquid of Resin Fine Particles containing Cycloolefin Copolymer and Low-density Polyethylene Cycloolefin copolymer (COC) resin, TOPAS (TM) produced by Polyplastics:
75 parts by mass
Polyethylene resin, EXCELLEN FX 351 produced by Sumitomo Chemical (density: 0.898 $g/cm^3$, weight average molecular weight Mw: 80000): 25 parts by mass
Xylene: 300 parts by mass
Anionic surfactant, NONSOUL LN-1 produced by NOF Corporation: 8 parts by mass
Ion exchanged water: 925 parts by mass The COC resin (a cycloolefin copolymer), the polyethylene resin, and the xylene were mixed or dissolved in an environment heated to 80° C. to form an oil phase. Also, the anionic surfactant and ion exchanged water were mixed and dissolved to form a water phase. The oil phase and the water phase were mixed. The mixture was agitated in an environment heated to 80° C. at 8000 rpm to 9000 rpm for about 30 minutes with ROBOMIX (manufactured by PRIMIX) to prepare an oil-in-water (O/W type) emulsion containing oil phases of about 1 μm.

The resulting emulsion was further heated to 80° C. and subjected to treatment three times with Starburst manufactured by Sugino Machine to prepare an oil-in-water (O/W type) emulsion containing oil phases of about 100 nm.

The resulting emulsion was subjected to distillation under reduced pressure to remove xylene. Thus, aqueous dispersion liquid E1 containing resin fine particles of about 80 nm containing the COC resin and the polyethylene (solids content: 10% by mass) was prepared.

The elastic deformation rate Es and the melting temperature Tm of the resin of the resin fine particles were measured by the above-described methods and were 79.0% and 110.06° C., respectively.

(3) Step of Applying Resin Fine Particles onto Surfaces of Core Particles a) Core particles C1: 10 parts by mass b) 0.1% by mass aqueous solution of anionic surfactant, Neogen RK produced by Dai-ichi Kogyo Seiyaku: 48 parts by mass c) 0.2% by mass aqueous solution of anionic surfactant, NONSOUL LN-1 produced by NOF Corporation: 0.5 part by mass d) Ion exchanged water: 133 parts by mass e) Resin fine particle aqueous dispersion liquid E1: 10 parts by mass f) 0.1% by mass aqueous solution of anionic surfactant, Neogen RK produced by Dai-ichi Kogyo Seiyaku: 115.2 parts by mass a) Core particles C1 produced in Step (1), b) 0.1% by mass aqueous solution of anionic surfactant, c) 0.2% by mass aqueous solution of anionic surfactant, and d) ion exchanged water were mixed to prepare a dispersion liquid of the core particles.

Also, e) aqueous dispersion liquid of the resin fine particles prepared in Step (2) and f) 0.1% by mass aqueous solution of anionic surfactant were mixed to prepare a dispersion liquid of shell fine particles.

The dispersion liquid of the core particles and the dispersion liquid of shell fine particles were mixed, and the mixture was heated up to a temperature of 43° C. with stirring in a heating water bath. When the liquid temperature had reached 43° C., 2 mol/L hydrochloric acid solution was dropped at a rate of 14 mL/min into the mixture being stirred. While a small amount of the mixture was taken out as required and filtered through a 2 μm microfilter for observing the filtrate, the hydrochloric acid solution was added until the filtrate became transparent, that is, until substantially all the resin fine particles dispersed in the mixture were lost by being attached to the core particles. Thus, dispersion liquid T1 of core particles uniformly coated with the resin fine particles was prepared.

(4) Step of Smoothing Surfaces of Toner particles (Core Particles Coated with Resin Fine Particles)

The aqueous dispersion liquid of the particles coated with the resin fine particles, prepared in Step (3) was repeatedly washed and filtered to remove the surfactant, and then dried in a dryer to yield particles T2 substantially uniformly coated with the resin fine particles.

Then, particles T2 were treated at 2500 rpm for 6 minutes with Hybridizer Model 1 (manufactured by Nara Machinery) to fix and smooth the resin fine particles defining the surfaces of particles T2. Thus, toner particles each having a surface containing a resin containing a cycloolefin copolymer and a low-density polyethylene were produced.

For treating the resulting toner particles with an external additive, 1.8 parts by mass of hydrophobized silica fine powder having a specific surface area (measured by the BET method) of 200 $m^2$/g was mixed into 100 parts by mass of the resulting toner particles in a dry process with a Henschel mixer (manufactured by Nippon Coke & Engineering).

Example 2

The present Example was performed in the same manner as Example 1, except for the following points:

The resin containing a cycloolefin copolymer and the resin containing a low-density polyethylene used in Step (2) of Example 1, including the proportions thereof, were replaced with the following resins:

COC resin, TOPAS (TM) produced by Polyplastics: 70 parts by mass

Polyethylene resin, SUMIKATHENE F-200 produced by Sumitomo Chemical (density: 0.924 g/$cm^3$, weight average molecular weight Mw: 70000): 30 parts by mass The elastic deformation rate Es and the melting temperature Tm of the resin of the resin fine particles were measured by the above-described methods and were 72.2% and 111.34° C., respectively.

Example 3

The present Example was performed in the same manner as Example 1, except for the following points:

The resin containing a cycloolefin copolymer and the resin containing a low-density polyethylene used in Step (2) of Example 1, including the proportions thereof, were replaced with the following resins:

COC resin, TOPAS (TM) produced by Polyplastics: 75 parts by mass

Polyethylene resin 1, EXCELLEN FX 452 produced by Sumitomo Chemical (density: 0.880 g/$cm^3$, weight average molecular weight Mw: 80000): 12.5 parts by mass Polyethylene resin, SUMIKATHENE F-200 produced by Sumitomo Chemical (density: 0.924 g/$cm^3$, weight average molecular weight Mw: 70000): 12.5 parts by mass The elastic deformation rate Es and the melting temperature Tm of the resin of the resin fine particles were measured by the above-described methods and were 79.3% and 110.67° C., respectively.

Example 4

The present Example was performed in the same manner as Example 1, except for the following points:

The resin containing a cycloolefin copolymer and the resin containing a low-density polyethylene used in Step (2) of Example 1, including the proportions thereof, were replaced with the following resins:

COC resin 1, TOPAS (TM) produced by Polyplastics: 50 parts by mass

COC resin 2, TOPAS (TB) produced by Polyplastics: 30 parts by mass

Polyethylene resin, EXCELLEN FX 351 produced by Sumitomo Chemical (density: 0.898 g/$cm^3$, weight average molecular weight Mw: 80000): 20 parts by mass The elastic deformation rate Es and the melting temperature Tm of the resin of the resin fine particles were measured by the above-described methods and were 78.0% and 115.54° C., respectively.

Example 5

The present Example was performed in the same manner as Example 1, except for the following points:

The resin containing a cycloolefin copolymer and the resin containing a low-density polyethylene used in Step (2) of Example 1, including the proportions thereof, were replaced with the following resins:

COC resin 1, TOPAS (TM) produced by Polyplastics: 50 parts by mass

COC resin 2, TOPAS (TB) produced by Polyplastics: 30 parts by mass

Polyethylene resin, EXCELLEN FX 452 produced by Sumitomo Chemical (density: 0.880 g/$cm^3$, weight average molecular weight Mw: 80000): 15 parts by mass The elastic deformation rate Es and the melting temperature Tm of the resin of the resin fine particles were measured by the above-described methods and were 78.0% and 114.33° C., respectively.

Example 6

The present Example was performed in the same manner as Example 1, except for the following points:

The resin containing a cycloolefin copolymer and the resin containing a low-density polyethylene used in Step (2) of Example 1, including the proportions thereof, were replaced with the following resins:

COC resin 1, APEL APL8008T produced by Mitsui Chemicals: 30 parts by mass

COC resin 2, TOPAS (TM) produced by Polyplastics: 30 parts by mass

Polyethylene resin, EXCELLEN FX 452 produced by Sumitomo Chemical (density: 0.880 g/$cm^3$, weight average molecular weight Mw: 80000): 20 parts by mass The elastic deformation rate Es and the melting temperature Tm of the resin of the resin fine particles were measured by the above-described methods and were 80.0% and 117.23° C., respectively.

Example 7

The present Example was performed in the same manner as Example 1, except for the following points:

The resin containing a cycloolefin copolymer and the resin containing a low-density polyethylene used in Step (2) of Example 1, including the proportions thereof, were replaced with the following resins:

COC resin, TOPAS (TM) produced by Polyplastics: 75 parts by mass

Polyethylene resin, FLOW BEADS CL 2080 produced by Sumitomo Seika Chemicals (density: 0.919 g/$cm^3$, weight average molecular weight Mw: 75000): 25 parts by mass The elastic deformation rate Es and the melting temperature Tm of the resin of the resin fine particles were measured by the above-described methods and were 78.6% and 111.02° C., respectively.

Example 8

The present Example was performed in the same manner as Example 1, except for the following points:

The resin containing a cycloolefin copolymer and the resin containing a low-density polyethylene used in Step (2) of Example 1, including the proportions thereof, were replaced with the following resins:

COC resin, TOPAS (TM) produced by Polyplastics: 50 parts by mass

Polyethylene resin, EXCELLEN FX 351 produced by Sumitomo Chemical (density: 0.898 g/$cm^3$, weight average molecular weight Mw: 80000): 50 parts by mass The elastic deformation rate Es and the melting temperature Tm of the resin of the resin fine particles were measured by the above-described methods and were 80.9% and 118.24° C., respectively. The resulting toner was slightly inferior in fixability due to a high Tm.

Example 9

The present Example was performed in the same manner as Example 1, except for the following points:

The resin containing a cycloolefin copolymer and the resin containing a low-density polyethylene used in Step (2) of Example 1, including the proportions thereof, were replaced with the following resins:

COC resin, TOPAS (TM) produced by Polyplastics: 25 parts by mass

Polyethylene resin, EXCELLEN FX 351 produced by Sumitomo Chemical (density: 0.898 g/$cm^3$, weight average molecular weight Mw: 80000): 75 parts by mass The elastic deformation rate Es and the melting temperature Tm of the resin of the resin fine particles were measured by the above-described methods and were 81.3% and 130.84° C., respectively.

The resulting toner was slightly inferior in fixability due to a high Tm.

Example 10

The present Example was performed in the same manner as Example 1, except for the following points:

The resin containing a cycloolefin copolymer and the resin containing a low-density polyethylene used in Step (2) of Example 1, including the proportions thereof, were replaced with the following resins:

COC resin, TOPAS (TM) produced by Polyplastics: 40 parts by mass

Polyethylene resin, EXCELLEN FX 452 produced by Sumitomo Chemical (density: 0.880 g/$cm^3$, weight average molecular weight Mw: 80000): 60 parts by mass The elastic deformation rate Es and the melting temperature Tm of the resin of the resin fine particles were measured by the above-described methods and were 84.6% and 133.62° C., respectively. The resulting toner was inferior in fixability due to a high Tm.

Example 11

The present Example was performed in the same manner as Example 1, except for the following points:

The resin containing a cycloolefin copolymer and the resin containing a low-density polyethylene used in Step (2) of Example 1, including the proportions thereof, were replaced with the following resins:

COC resin, APEL APL8008T produced by Mitsui Chemicals: 50 parts by mass

Polyethylene resin, EXCELLEN FX 452 produced by Sumitomo Chemical (density: 0.880 g/$cm^3$, weight average molecular weight Mw: 80000): 50 parts by mass The elastic deformation rate Es and the melting temperature Tm of the resin of the resin fine particles were measured by the above-described methods and were 82.7% and 128.30° C., respectively. The resulting toner was slightly inferior in fixability due to a high Tm.

Example 12

The present Example was performed in the same manner as Example 1, except for the following points:

The resin containing a cycloolefin copolymer and the resin containing a low-density polyethylene used in Step (2) of Example 1, including the proportions thereof, were replaced with the following resins:

- COC resin, TOPAS (TM) produced by Polyplastics: 75 parts by mass
- Polyethylene resin 1, EXCELLEN FX 452 produced by Sumitomo Chemical (density: 0.880 g/cm$^3$, weight average molecular weight Mw: 80000): 12.5 parts by mass
- Polyethylene resin 2, SUMIKATHENE F-200 produced by Sumitomo Chemical (density: 0.924 g/cm$^3$, weight average molecular weight Mw: 70000): 12.5 parts by mass The proportion of the aqueous dispersion liquid of the resin fine particles, 10 parts by mass in Step (3) in Example 1, was varied to 20 parts by mass.

The resulting toner was slightly inferior in fixability due to a high proportion of the polyethylene to the entire toner.

Example 13

The present Example was performed in the same manner as Example 1, except for the following points:

The resin containing a cycloolefin copolymer and the resin containing a low-density polyethylene used in Step (2) of Example 1, including the proportions thereof, were replaced with the following resins:

- COC resin 1, TOPAS (TM) produced by Polyplastics: 50 parts by mass
- COC resin 2, TOPAS (TB) produced by Polyplastics: 30 parts by mass
- Polyethylene resin, EXCELLEN FX 351 produced by Sumitomo Chemical (density: 0.898 g/cm$^3$, weight average molecular weight Mw: 80000): 20 parts by mass The proportion of the aqueous dispersion liquid of the resin fine particles, 10 parts by mass in Step (3) in Example 1, was varied to 20 parts by mass.

The resulting toner was slightly inferior in fixability due to a high proportion of the polyethylene to the entire toner.

Example 14

The present Example was performed in the same manner as Example 1, except for the following point:

The proportion of the aqueous dispersion liquid of the resin fine particles, 10 parts by mass in Step (3) in Example 1, was varied to 2 parts by mass.

Example 15

The present Example was performed in the same manner as Example 1, except that the resins used in Step (2) were replaced with the following resins:

- Polyester resin (polycondensate of propylene oxide-modified bisphenol A and isophthalic acid, glass transition temperature Tg=65° C., weight average molecular weight Mw=10000, number average molecular weight Mn=6000): 75 parts by mass
- Polyethylene resin, EXCELLEN FX 351 produced by Sumitomo Chemical: 25 parts by mass The elastic deformation rate Es and the melting temperature Tm of the resin of the resin fine particles were measured by the above-described methods and were 78.8% and 105.46° C., respectively.

Example 16

The present Example was performed in the same manner as Example 1, except that the resins used in Step (2) were replaced with the following resins:

- Polyester resin (polycondensate of propylene oxide-modified bisphenol A and isophthalic acid, glass transition temperature Tg=65° C., weight average molecular weight Mw=10000, number average molecular weight Mn=6000): 90 parts by mass
- Polyethylene resin, EXCELLEN FX 351 produced by Sumitomo Chemical: 10 parts by mass The elastic deformation rate Es and the melting temperature Tm of the resin of the resin fine particles were measured by the above-described methods and were 71.9% and 102.83° C., respectively.

Example 17

The present Example was performed in the same manner as Example 1, except that the resins used in Step (2) were replaced with the following resins:

- Polyester resin (polycondensate of propylene oxide-modified bisphenol A and isophthalic acid, glass transition temperature Tg=65° C., weight average molecular weight Mw=10000, number average molecular weight Mn=6000): 70 parts by mass
- Polyethylene resin, SUMIKATHENE F-200 produced by Sumitomo Chemical: 30 parts by mass The elastic deformation rate Es and the melting temperature Tm of the resin of the resin fine particles were measured by the above-described methods and were 72.1% and 106.28° C., respectively.

Example 18

The present Example was performed in the same manner as Example 1, except that the resins used in Step (2) were replaced with the following resins:

- Polyester resin (polycondensate of propylene oxide-modified bisphenol A and terephthalic acid, glass transition temperature Tg=76° C., weight average molecular weight Mw=11000, number average molecular weight Mn=4200): 75 parts by mass
- Polyethylene resin, FLOW BEADS CL 2080 produced by Sumitomo Seika Chemicals: 25 parts by mass The elastic deformation rate Es and the melting temperature Tm of the resin of the resin fine particles were measured by the above-described methods and were 78.2% and 106.50° C., respectively.

Example 19

The present Example was performed in the same manner as Example 1, except that the resins used in Step (2) were replaced with the following resins:

- Styrene resin (styrene-methacrylic acid-methyl methacrylate copolymer, glass transition temperature Tg=91° C., weight average molecular weight Mw=15000, number average molecular weight Mn=8000): 80 parts by mass
- Polyethylene resin, EXCELLEN FX 351 produced by Sumitomo Chemical: 20 parts by mass The elastic deformation rate Es and the melting temperature Tm of the resin of the resin fine particles were measured by the above-described methods and were 77.6% and 112.61° C., respectively.

Example 20

The present Example was performed in the same manner as Example 1, except that the resins used in Step (2) were replaced with the following resins:

Styrene resin (styrene-methacrylic acid-methyl methacrylate copolymer, glass transition temperature Tg=91° C., weight average molecular weight Mw=15000, number average molecular weight Mn=8000): 60 parts by mass Polyethylene resin 1, EXCELLEN FX 452 produced by Sumitomo Chemical: 20 parts by mass Polyethylene resin 2, SUMIKATHENE F-200 produced by Sumitomo Chemical: 20 parts by mass The elastic deformation rate Es and the melting temperature Tm of the resin of the resin fine particles were measured by the above-described methods and were 81.2% and 118.20° C., respectively.

Example 21

The present Example was performed in the same manner as Example 1, except that the resins used in Step (2) were replaced with the following resins:

Styrene resin (styrene-methacrylic acid-methyl methacrylate copolymer, glass transition temperature Tg=93° C., weight average molecular weight Mw=21000, number average molecular weight Mn=9000): 80 parts by mass Polyethylene resin, FLOW BEADS CL 2080 produced by Sumitomo Seika Chemicals: 20 parts by mass The elastic deformation rate Es and the melting temperature Tm of the resin of the resin fine particles were measured by the above-described methods and were 76.3% and 122.10° C., respectively.

Comparative Example 1

The present Comparative Example was performed basically in the same manner as Example 1, except for the following point:

In Step (2), the resin containing a low-density polyethylene was not added, and the following resin containing a cycloolefin copolymer was used with the following proportion:

COC resin, TOPAS (TM) produced by Polyplastics: 100 parts by mass

The elastic deformation rate Es and the melting temperature Tm of the resin of the resin fine particles were measured by the above-described methods and were 67.0% and 108.84° C., respectively.

Comparative Example 2

The present Comparative Example was performed basically in the same manner as Example 1, except for the following point:

In Step (2), the resin containing a low-density polyethylene was not added, and the following resins containing a cycloolefin copolymer were used with the following proportions:

COC resin 1, TOPAS (TM) produced by Polyplastics: 70 parts by mass

COC resin 2, TOPAS (TB) produced by Polyplastics: 30 parts by mass

The elastic deformation rate Es and the melting temperature Tm of the resin of the resin fine particles were measured by the above-described methods and were 66.1% and 112.30° C., respectively.

Comparative Example 3

The present Comparative Example was performed basically in the same manner as Example 1, except for the following point:

The resin containing a low-density polyethylene used in Step (2) in Example 1 was replaced with a low-density polyethylene wax having a still lower density, and this wax and the resin containing a cycloolefin copolymer were used with the following proportions:

COC resin, TOPAS (TM) produced by Polyplastics: 70 parts by mass

Low-density polyethylene wax, HI-WAX NL 500 produced by Mitsui Chemicals (density: 0.920 g/$cm^3$, weight average molecular weight Mw: 4200): 30 parts by mass Comparative Example 4

The present Example was performed basically in the same manner as Example 1, except that the following resin was used in Step (2):

Polyester resin (polycondensate of propylene oxide-modified bisphenol A and terephthalic acid, glass transition temperature Tg=76° C., weight average molecular weight Mw=11000, number average molecular weight Mn=4200): 100 parts by mass The elastic deformation rate Es and the melting temperature Tm of the resin of the resin fine particles were measured by the above-described methods and were 62.2% and 99.20° C., respectively.

Evaluations

Each of the toners produced in the above-described Examples and Comparative Examples was subjected to the following evaluations. The results are shown in Table 1.

Transfer Efficiency

The transfer efficiency is an index of transferability and represents what percent of the toner developed on the photosensitive drum is transferred to the intermediate transfer belt. For the evaluation of transfer efficiency, the drum cartridge of a full color electrophotographic apparatus LBP-5050 manufactured by Canon was charged with the toner to be tested, and the same cyan solid patterns were continuously formed on recording media sheets. The transfer efficiency was measured after the solid patterns had been formed on 3000 recording media sheets. The transfer efficiency was defined as the percentage of the density of the toner on the intermediate transfer belt to the sum of the density of the toner transferred to the intermediate transfer belt and the density of the toner remaining on the photosensitive drum even after transfer. The higher the percentage, the higher the transfer efficiency even after the durability test. The transfer efficiency was evaluated according to the following criteria, and the results are shown in Tables 1 and 2.

A: Excellent (when the transfer efficiency was 98% or more)

B: Good (when the transfer efficiency was in the range from 95% to less than 98%)

C: Usable in practice (when the transfer efficiency was in the range from 90% to less than 95%)

D: Poor (when the transfer efficiency was less than 90%)

Toners exhibiting a transfer efficiency of 95% or more were considered good.

TABLE 1

| | Proportion (%) | | |
|---|---|---|---|
| | Cycloolefin polymer | Polyethylene | Transfer efficiency |
| Example 1 | 75 | 25 | A |
| Example 2 | 70 | 30 | B |
| Example 3 | 75 | 25 | A |
| Example 4 | 80 | 20 | A |
| Example 5 | 85 | 15 | A |
| Example 6 | 85 | 15 | A |
| Example 7 | 75 | 25 | A |
| Example 8 | 50 | 50 | A |
| Example 9 | 25 | 75 | A |
| Example 10 | 40 | 60 | A |
| Example 11 | 50 | 50 | A |
| Example 12 | 75 | 25 | A |
| Example 13 | 80 | 20 | A |
| Example 14 | 75 | 25 | C |
| Comparative Example 1 | 100 | 0 | D |
| Comparative Example 2 | 100 | 0 | D |
| Comparative Example 3 | 70 | 30 | D |

TABLE 2

| | Resin physical property | | Transfer |
|---|---|---|---|
| | Es | Tm (° C.) | efficiency |
| Example 1 | 79.0 | 110.06 | A |
| Example 2 | 72.2 | 111.34 | B |
| Example 3 | 79.3 | 110.67 | A |
| Example 4 | 78.0 | 115.54 | A |
| Example 5 | 78.0 | 114.33 | A |
| Example 6 | 80.0 | 117.23 | A |
| Example 7 | 78.6 | 111.02 | A |
| Example 8 | 80.9 | 118.24 | A |
| Example 15 | 78.8 | 105.46 | A |
| Example 16 | 71.9 | 102.83 | B |
| Example 17 | 72.1 | 106.28 | B |
| Example 18 | 78.2 | 106.50 | A |
| Example 19 | 77.6 | 112.61 | A |
| Example 20 | 81.2 | 118.20 | A |
| Example 21 | 76.3 | 122.10 | A |
| Comparative Example 1 | 67.0 | 108.84 | D |
| Comparative Example 2 | 62.2 | 99.20 | D |
| Comparative Example 4 | 66.1 | 112.30 | D |

Evaluation Results

Examples 1 to 7 satisfactorily exhibited the advantageous effect of the present disclosure.

In Examples 1 to 7, each toner was produced so that a resin containing a cycloolefin copolymer and a polyethylene having a density of less than 0.930 g/$cm^3$ and a molecular weight in a range from 10 thousands to several millions could be present on the surface of the toner particles.

Thus, the external additive at the surfaces of toner particles was prevented from being buried in the surfaces of the toner particles. Also, since the resin containing a cycloolefin copolymer and a polyethylene defines the surfaces of the toner particles, the surfaces of the toner particles can be less hygroscopic, and accordingly, the toner can exhibit stable chargeability independent of environment and does not remain much after transfer, over a long time use.

In Comparative Examples 1 and 2, on the other hand, the surfaces of the toner particles are defined by a resin containing a cycloolefin copolymer, but not containing a polyethylene. Consequently, the elastically deformability of the low-density polyethylene cannot be imparted to the surfaces of the toner particles, and the surfaces of the toner particles are not resistant to plastic deformation. Thus, the external additive is buried through a long-time use. This is probably a reason why the toner remained.

In Comparative Example 3, a polyethylene wax containing a low-density polyethylene having a molecular weight of less than 10 thousands was used. If the molecular weight of the polyethylene is excessively low compared to the molecular weight of the resin of the surfaces of the toner particles, the flexibility the low-density polyethylene intrinsically has is lost. Consequently, the resin of the surfaces of the toner particles cannot exhibit a high elastic deformability, and thus the external additive is buried. This is probably a reason why the toner remained.

In Examples 8 to 11, each toner was produced so that the proportion of the cycloolefin copolymer could be lower than that of the polyethylene in the surfaces of the toner particles. In these Examples, the minimum fixing temperature tends to be higher than that of the toners in Examples 1 to 7. This is probably because the proportion of the cycloolefin copolymer is smaller than that of the low-density polyethylene, and consequently because the resin defining the surfaces of the toner particles can be more viscous.

While the proportion of the polyethylene in the surfaces of the toner particles is specified in the present disclosure, the content of the polyethylene in the entirety of the toner is desirably less than 3% from the viewpoint of the low-temperature fixability of the toner.

In Examples 12 and 13, the proportion of the cycloolefin copolymer in the surfaces of the toner particles is higher than that of the polyethylene, and the content of the polyethylene in the entirety of the toner exceeds 3%. The toners of these Examples exhibited good transferability, but the minimum fixing temperature thereof was slightly increased.

If the total amount of the resin containing a cycloolefin copolymer and a low-density polyethylene is extremely small in the surfaces of the toner particles, the advantageous effect of the present disclosure is reduced. Accordingly, it is desirable that the resin content in the toner be 0.5% or more, more desirably 3% or more.

In Example 14, the content in the toner of the resin containing a cycloolefin copolymer and a low-density polyethylene was about 0.5%. As a result, the hygroscopicity of the surfaces of the toner particles was not much reduced and the resistance to the burying of the external additive was not much increased, compared to Examples 1 to 13. Thus the toner was inferior in transfer efficiency to the toners of other Examples.

In Examples 1 to 8, the surfaces of the toner particles contain a resin having an elastic deformation rate of 70% or more and a melting temperature Tm of 125.0° C. or less.

In Examples 15 to 21, each toner was produced in a different manner in which resins different from the resin used in Example 1 were mixed so that the mixed resin could have a desired elastic deformation rate Es and melting temperature Tm, and the this resin was used for forming the surfaces of the toner particles.

These Examples suggest that as long as a resin having an elastic deformation rate Es of 70% or more and a melting temperature Tm of 125.0° C. or less is used as the resin defining the surface of the toner particles, the external additive can be prevented from being buried in the surfaces of the toner particles, independent of what resin is used, and the fixing temperature can be reduced.

In Comparative Examples 1, 2, and 4, the toners were produced using a resin having an elastic deformation rate Es of less than 70%. Therefore the surfaces of the toner particles were not able to exhibit high elastic deformability and were thus insufficient in resistance to plastic deformation. Consequently, the external additive was buried during the durability test. This is probably a reason why the transfer efficiency was reduced.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

What is claimed is:

1. A toner comprising:

toner base particles; and an external additive, wherein a resin which has an elastic deformation rate of 70% or more and a melting temperature of 125.0° C. or less is contained in surfaces of the toner base particles.

2. The toner according to claim 1, wherein the elastic deformation rate of the resin is 85% or less.

3. The toner according to claim 1, wherein the melting temperature of the resin is 100.0° C. or more.

* * * * *